United States Patent [19]

Takahashi et al.

[11] Patent Number: 5,420,686
[45] Date of Patent: May 30, 1995

[54] POLARIZATION INTERFEROMETER OPTICAL VOLTAGE DETECTOR UTILIZING MOVEMENT OF INTERFERENCE FRINGE

[75] Inventors: Hironori Takahashi; Tsuneyuki Urakami; Shinichiro Aoshima, all of Shizuoka, Japan

[73] Assignee: Hamamatsu Photonics K.K., Shizuoka, Japan

[21] Appl. No.: 200,568

[22] Filed: Feb. 22, 1994

Related U.S. Application Data

[63] Continuation of Ser. No. 857,585, Mar. 25, 1992, abandoned.

[30] Foreign Application Priority Data

Mar. 26, 1991 [JP] Japan ................................. 3-086245
Apr. 11, 1991 [JP] Japan ................................. 3-106843

[51] Int. Cl.⁶ ............................................. G01B 9/02
[52] U.S. Cl. ................................... 356/351; 356/345
[58] Field of Search ............... 356/351, 352, 346, 345; 250/227.11; 385/14

[56] References Cited

U.S. PATENT DOCUMENTS

| | | | |
|---|---|---|---|
| 4,232,333 | 11/1980 | Hiruma et al. | 358/93 |
| 4,867,565 | 9/1989 | Leguime | 356/351 |
| 5,041,779 | 8/1991 | Hales | 324/96 |
| 5,067,815 | 11/1991 | Kotrotsios | 356/351 |
| 5,200,796 | 4/1993 | Leguime | 356/351 |

FOREIGN PATENT DOCUMENTS 0197196 10/1986 European Pat. Off.

OTHER PUBLICATIONS

"High Precision Retardation Measurement Using Phase Detection of Youngg's Fringes", Suezou Nakadate, Applied Optics, vol. 29, No. 2, Jan. 10, 1990, pp. 242–246.

"Advances in Streak Camera Instrumentation for the Study of Biological and Physical Processes", Yutaka Tsuchiya, IEEE Journal of Quantum Electronics, vol. QE-20, No. 12, Dec. 1984, pp. 1516–1528.

"Ultrafast Optical Waveform Characterization", Yutaka Tsuchiya, et al., SPIE vol. 1032, High Speed Photography and Photonics, 1988, pp. 459–467.

"Polarization Interferometer for Measuring Induced Anisotropy", V. A. Zamkov and V. A. Radkevich (pp. 811–816) pp. 437–439.

"Interferometer performing the product of three quantitites. Measurement of photorefraction and photogyration in $LiIO_3$ and $Ba_2NaNb_5O_{15}$ single crystals", I. A. Rokos, et al., Opt. Spectrosc. (USSR) 64(3), Mar. 1988. pp. 395–397.

"Fringe Scanning Scatter Plate Interferometer Using a Polarizd Light", June jei Huang, et al., Optics Communications, vol. 68, No. 4, Oct. 15, 1988, pp. 235–238.

"Ring polarization interferometer. Measurement of the flow rates of transparent media", I. A. Rokos et al., Opt. Spectrosc. (USSR) 53(2), Aug. 1982, pp. 186–190.

"Analysis of the interference of polarized rays by the method of the Poincare sphere", L. A. Rokosova, et al., Opt. Spectrosc. (USSR) 54(5) May 1983, pp. 496–500.

"Mise en Oeuvre et Optimisaton 3'un Modulateur de Retard Optique", M. Allain, et al., Optics Communications, vol. 11, No. 2, Jun. 1974, pp. 196–200.

"Probleme d'Asservissement Pose en Interferometrie a Modulation de Phase par l'Instabilite du Modulateur", Michel Allain, et al., Optics Communications, vol. 39, No. 3, Oct. 1, 1981, pp. 113–117.

*Primary Examiner*—Samuel A. Turner
*Attorney, Agent, or Firm*—Finnegan, Henderson, Farabow, Garrett & Dunner

[57] ABSTRACT

Polarized light is input to an optical modulator typically consisting of an electrooptic crystal. The polarization state of the input light is changed in accordance with a voltage being applied to the optical modulator. Receiving the light output from the optical modulator, a polarization interferometer produces an interference fringe on the input surface of a photodetector such as a streak camera and a CCD line sensor. Based on an output signal of the photodetector, an analyzing device calculates a pitch and a movement distance of the interference fringe to determine the voltage being applied to the optical modulator.

22 Claims, 7 Drawing Sheets

INPUT VOLTAGE V

0

$V\pi$ $2V\pi$ $3V\pi$

POSITION ON INPUT SURFACE

5,420,686

POLARIZATION INTERFEROMETER OPTICAL VOLTAGE DETECTOR UTILIZING MOVEMENT OF INTERFERENCE FRINGE

This application is a continuation of application Ser. No. 07/857,585, filed Mar. 25, 1992, now abandoned.

BACKGROUND OF THE INVENTION

The present invention relates to a voltage detector utilizing the electrooptical effect.

Figure 1:
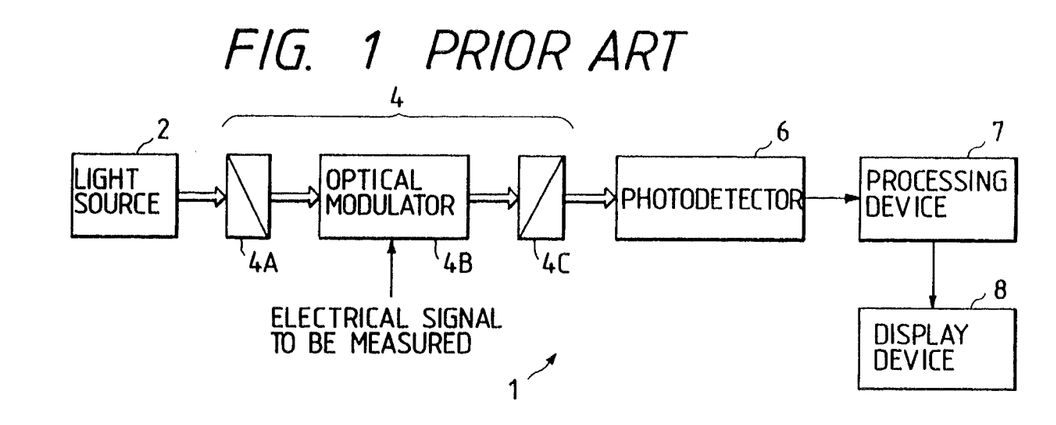
FIG. 1 is a block diagram showing a conventional voltage detector.

FIG. 1 shows a conventional voltage detector 1 which uses an electrooptical amplitude modulator 4. Input light from a light source 2 is modulated by the electrooptical amplitude modulator 4 in accordance with an electrical signal (i.e., voltage) being provided thereto. Output light from the modulator 4 is detected by a photodetector 6. An output signal of the photodetector 6 is subjected to necessary processing in a processing device 7, and then displayed on a display device 8.

Figures 2, 4:
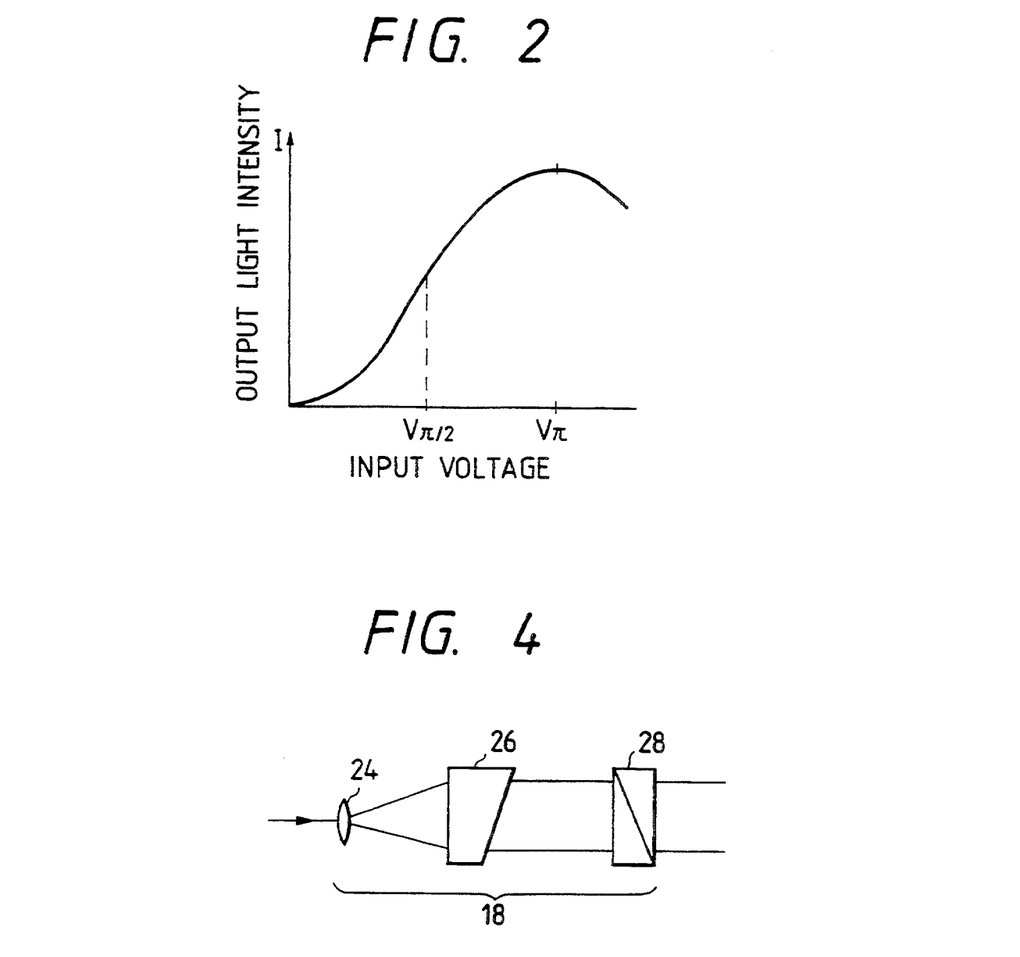
FIG. 2 is a graph showing a relationship between a voltage applied to an electrooptical amplitude modulator and intensity of output light therefrom.
FIG. 4 is a block diagram showing an example of a polarization interferometer used in the first embodiment.

The electrooptical amplitude modulator 4 consists of an optical modulator 4B which receives the electrical signal to be measured, and a polarizer 4A and analyzer 4C disposed on the input and output side of the optical modulator 4B, respectively. As shown in FIG. 2, the electrooptical amplitude modulator 4 utilizes the following relationship between the input voltage V and the output light intensity I:

$$I = I_0 \sin^2\{(\pi/2)(V/V_\pi)\} \quad (1)$$

where $I_0$ is the input light intensity and $V_\pi$ is the half-wave voltage of the electrooptical amplitude modulator 4. Further, it is assumed that attenuation due to light absorption does not occur in the modulator 4.

If a high-speed photodetector, such as a streak camera, is employed as the photodetector 6, a high-speed voltage detector can be constructed.

In the above-described voltage detector 1, since the output light intensity I is not proportional to the voltage V being applied, the output signal of the photodetector 6 should be subjected to a conversion process based on equation (1) in the processing device 7 to obtain a signal properly representing the input voltage.

Where the input voltage is small, the resulting output light intensity from the electrooptical amplitude modulator 4 is also small, preventing accurate voltage measurements. Further, there is a problem that noise in the light intensity of the light source 2 deteriorates the S/N ratio of the output signal.

SUMMARY OF THE INVENTION

The present invention has been made in view of the above problems in the art, and has an object of providing a voltage detector which can produce an output signal properly representing a voltage being measured without subjecting an output signal of a photodetector to a conversion process, which can detect a small voltage, and which is free from an S/N ratio deterioration due to light intensity noise in a light source.

According to the invention, a voltage detector comprises:
 light source means for emitting polarized light;
 modulating means for changing a polarization state of the polarized light in accordance with a voltage being applied thereto;
 polarization interferometer means, coupled to the modulating means, for producing an interference fringe; and
 detecting means for determining the voltage being applied to the modulating means at least based on a movement distance of the interference fringe formed on an input surface of the detecting means.

According to the voltage detector having the above construction, the movement distance of the interference fringe is proportional to the input voltage. Therefore, precise measurements can be made without the need of performing a conversion process to obtain an output signal properly representing the input voltage. Even a smaller input voltage can easily be measured. Even where light intensity noise occurs in the light source means, it does not cause movement of the interference fringe and, therefore, the S/N ratio of the output signal is not deteriorated.

DESCRIPTION OF THE PREFERRED EMBODIMENTS

Embodiments of the present invention are described hereinafter with reference to the accompanying drawings.

Figure 3:
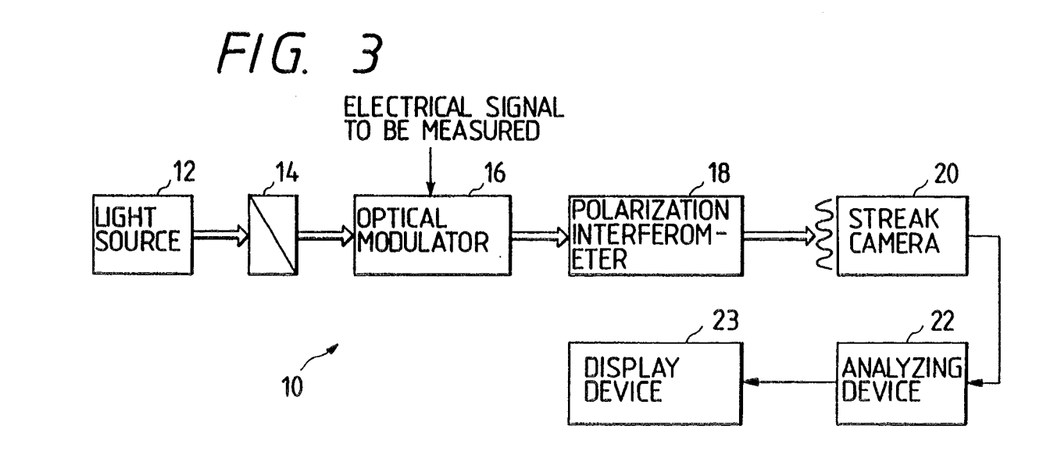
FIG. 3 is a block diagram showing a high-speed voltage detector according to a first embodiment of the present invention.

A first embodiment of the invention is directed to a high-speed voltage detector utilizing a streak camera. As shown in FIG. 3, a high-speed voltage detector 10 consists of a light source 12, polarizer 14, optical modulator 16 having an electrooptic crystal to which an electrical signal (i.e., voltage) to be measured is applied, polarization interferometer 18, streak camera 20 for receiving output light from the polarization interferometer 18, analyzing device 22 for analyzing an output signal of the streak camera 20, and display device 23. These components are arranged in the above order from the light source 12. The electrical signal is measured based on a movement distance of an interference fringe which is formed on the input surface of the streak camera 20 and moves in accordance with a variation of the electrical signal being applied to the optical modulator 16. The polarizer 14 may be omitted if the light source 12 emits polarized light.

As shown in FIG. 4, the polarization interferometer 18 consists of an objective lens 24, birefringent crystal 26 and analyzer 28, which are arranged in this order. The analyzer 28 is so arranged that its polarizing direction forms an angle of 45° with the optic axis of the birefringent crystal 26.

Figure 5:
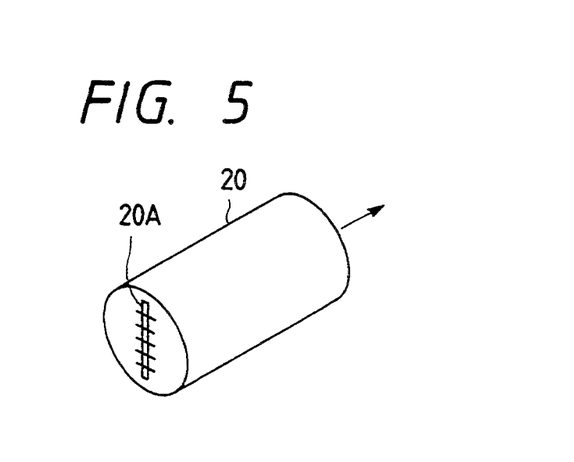
FIG. 5 is a perspective view showing how an interference fringe is formed on an entrance slit of a streak camera.

As shown in FIG. 5 the streak camera 20 is so arranged that its entrance slit 20A traverses bands of the interference fringe. The analyzing device 22 determines the input voltage V based on equation (2) (described below) using intervals A between peaks of the interference fringe and a movement distance X of the peaks, which are obtained from an output image of the streak camera 20.

The operation of the voltage detector 10 according to the first embodiment is described next.

Upon entrance into the polarization interferometer 18, the polarized light is expanded by the objective lens 24, and then input to the birefringent crystal 26. In the birefringent crystal 26, the input light beam is split into two beams which have different polarization states in a direction determined by the optic axis of the crystal 26 and in a direction perpendicular thereto, and which travel along different paths. As a result, the two beams having an optical path difference are output from the polarization interferometer 18. Since, as described above, the analyzer 28 is so arranged that its polarizing direction forms an angle of 45° with the optic axis of the birefringent crystal 26, the two beams output from the birefringent crystal 26 and having orthogonal polarization states interfere with each other after passing through the analyzer 28, and the resulting interference fringe is formed on the input surface of the streak camera 20, i.e., the entrance slit 20A.

On the other hand, the optical modulator 16 changes the polarization state of the light in accordance with the electrical signal being applied, and provides the resulting light to the polarization interferometer 18. Therefore, the interference fringe, which is formed on the input surface of the streak camera 20 by the polarization interferometer 18, moves in proportion to the polarization state variation caused by the optical modulator 16, i.e., in proportion to the input voltage variation.

The movement distance X of the interference fringe is given by:

$$X = (A/2)(V/V_\pi) \qquad (2)$$

where A represents an interval of the interference fringe, V the voltage being applied to the optical modulator 16, and $V_\pi$ the half-wave voltage.

Figure 6:
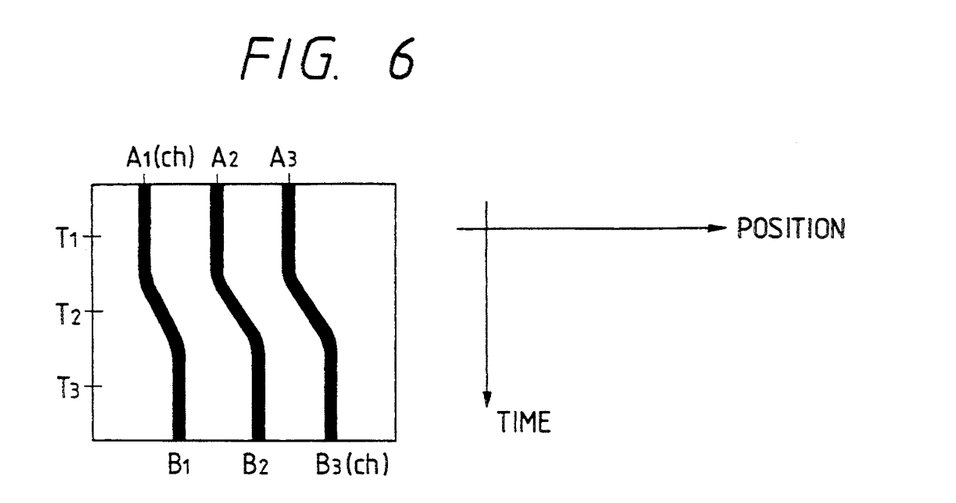
FIG. 6 shows an example of an output image of the streak camera.

FIG. 6 shows an example of an output image of the streak camera 20 when a step-function-like electrical signal is applied. When no voltage is applied to the optical modulator 16 (at time T1), peak positions (channels) of the output image, which has been caused by the interference fringe, appear as indicated by A1–A3 in FIG. 6. In the image of FIG. 6, the vertical axis corresponds to time, and the horizontal axis to a position on the entrance slit 20A. The analyzing device 22 determines the channels A1–A3 of the three peaks to obtain the interval A of the interference fringe.

When an electrical signal of a certain level is applied to the optical modulator 16 at time T2, the interference fringe is moved. Then, channels B1–B3 of the peaks in the output image of the streak camera 20, which has been caused by the interference fringe, are determined. A movement distance X of the interference fringe is determined by comparing the channels B1–B3 with the channels A1–A3.

The voltage V is finally determined based on the movement distance X and interval A of the interference fringe and the known value $V_\pi$ in the manner as described above. A waveform of the input electrical signal is obtained by performing this calculation over the entire period in the analyzing device 22.

It is noted that the streak camera 20 can measure the input electrical signal in the form of not only a repetitive phenomenon but also a single phenomenon. Further, although the interference fringe is detected by the streak camera 20 in the above embodiment, the invention is not limited to this configuration. Other one-dimensional or two-dimensional high-speed photodetectors may be used instead of the streak camera 20, to constitute a high-speed voltage detector.

Further, the angle formed by the polarizing direction of the analyzer 28 and the optic axis of the birefringent crystal 26 is not limited to 45°, but may be any angle as long as they are not parallel with or perpendicular to each other.

Next, a voltage detector according to a second embodiment of the invention is described.

Figure 7:
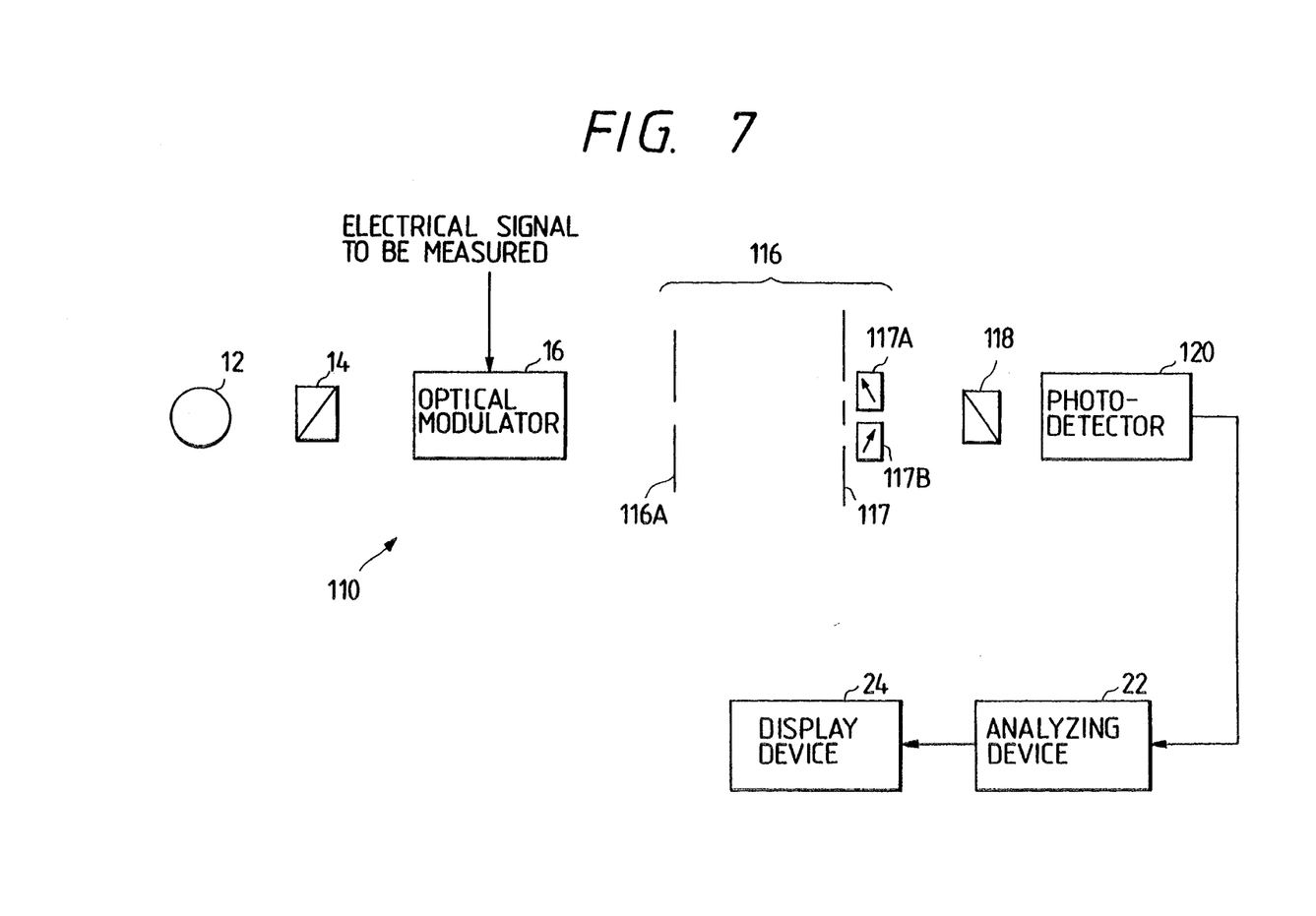
FIG. 7 is a block diagram showing a voltage detector according to a second embodiment of the invention.

As shown in FIG. 7, a voltage detector 110 of the second embodiment includes a light source 12, polarizer 14, optical modulator 16 for modulating input light in accordance with an electrical signal being applied, Young's interferometer 116 having polarizer elements 117A and 117B, analyzer 118, photodetector 120, analyzing device 22 for analyzing an output signal of the photodetector 120, and display device 24 for displaying analysis results of the analyzing device 22. The above components are arranged in the above order from the light source 12.

Young's interferometer 116 consists of a single slit 116A and a double slit 117. Two slits of the double slit 117 extend in parallel with the single slit 116A, and are equipped with respective polarizer elements 117A and 117B which have orthogonal polarizing directions.

The polarizer 14 and the analyzer 118 are so arranged that their polarizing directions are identical or perpendicular to each other. The polarizing elements 117A, 117B of the double slit 117 are so arranged that their polarizing directions form angles of +45° and −45° with the polarizing direction of the polarizer 14, respectively.

The photodetector 120 is either a one-dimensional photodetector or two-dimensional photodetector. Examples of the one-dimensional photodetector are a photodiode array, one-dimensional CCD line sensor and one-dimensional semiconductor position-sensitive detector. A CCD camera, two-dimensional semiconductor position-sensitive detector and image pickup tube are used as the two-dimensional photodetector. Further, a high-speed voltage detector can be constructed by using a streak camera as the photodetector 120, as in the case of the first embodiment.

The analyzing device 22 detects a movement distance of an interference fringe from a light and shade pattern of the interference fringe, i.e., an output pattern of the photodetector 120.

The operation of the voltage detector 110 of the second embodiment is described below.

Polarized light from the polarizer 14 passes through the optical modulator 16, Young's interferometer 116 and analyzer 118, so that an interference fringe is formed on the input surface of the photodetector 120. When an electrical signal (i.e., voltage) is applied to the optical modulator 14, the polarization state of the output light of the optical modulator 14 is changed in accordance with the electrical signal being applied and the interference fringe formed on the input surface of the photodetector 120 is moved accordingly.

An interval A of bands of the interference fringe is given by:

$$A = \lambda L / 2d \qquad (3)$$

where $\lambda$ represents a wavelength of light emitted from the light source 12, L a distance between the double slit 117 and the photodetector 120, and $2d$ an interval between the two slits of the double slit 117. Further, a movement distance X of the interference fringe is moved in proportion to the voltage V being applied to the optical modulator 14, and is expressed as:

$$X = (A/2)(V/V_\pi) \qquad (4)$$

which has the same expression as equation (2) described above. The voltage can be obtained by determining the movement distance X based on equations (3) and (4) in the analyzing device 22.

In the following, a high voltage detector according to a third embodiment is described.

Figure 8:
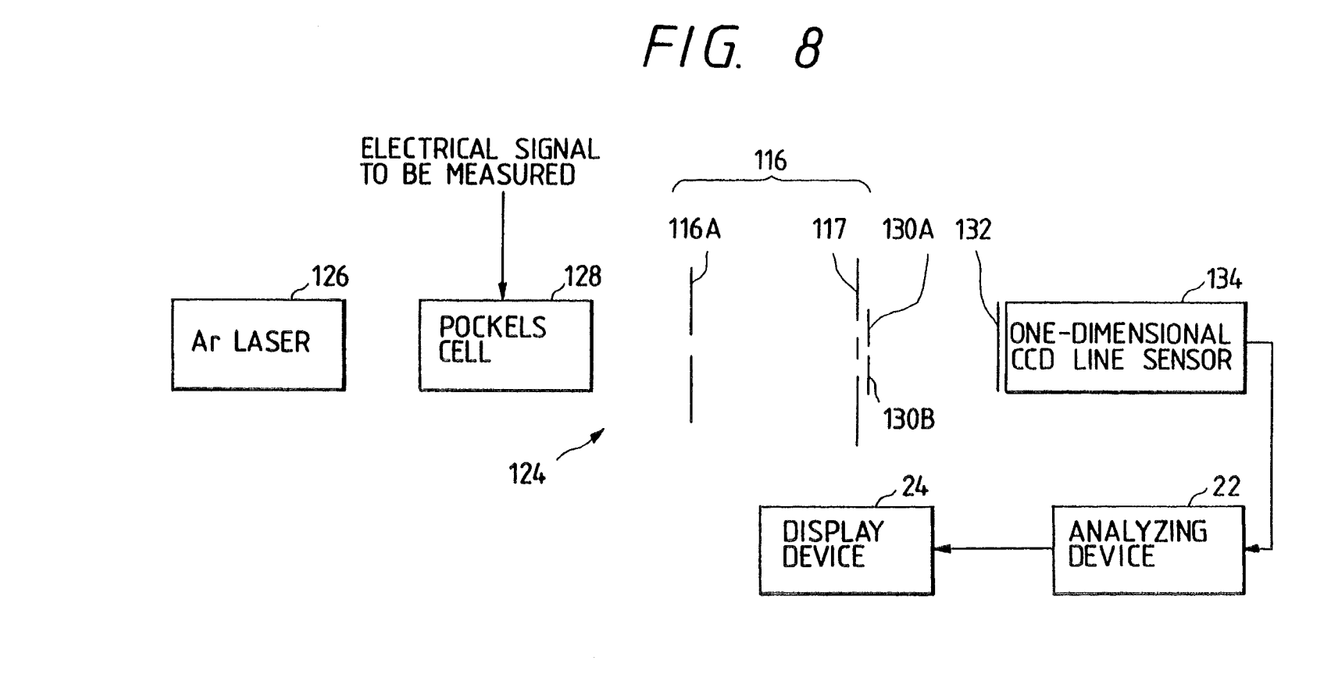
FIG. 8 is a block diagram showing a high voltage detector according to a third embodiment of the invention.

As shown in FIG. 8, a high voltage detector 124 includes an argon laser 126 (acting as the light source 12 of FIG. 7), a Pockels cell 128 (optical modulator 16) using a bulk crystal and having a half-wave voltage $V_\pi$ of 2 kV, Young's interferometer 116 in which film-type polarizers 130A and 130B are attached to the double slit 117, a film-type analyzer 132 (analyzer 118), and a one-dimensional CCD line sensor 134 (photodetector 120).

Figure 9:
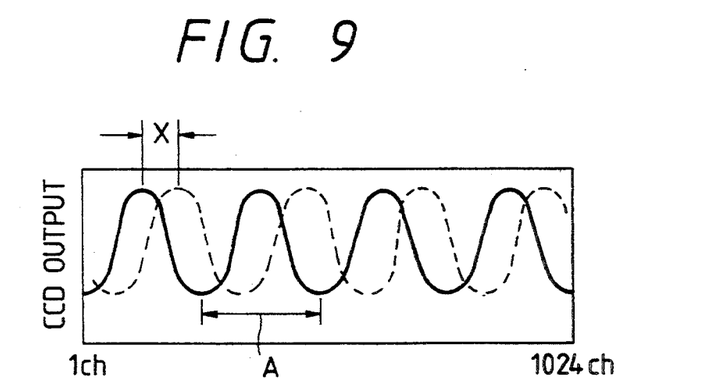
FIG. 9 shows an output of a one-dimensional CCD line sensor used in the third embodiment of FIG. 8.

FIG. 9 shows an example of an output of the one-dimensional CCD line sensor 134. The analyzing device 22 detects peak positions of the output of the one-dimensional CCD line sensor 134. In the case of FIG. 9, four peak positions are detected, and their intervals A are determined. The determination of a plurality of intervals A contributes to improvement of the measurement accuracy.

When a voltage is applied to the Pockels cell 128, the interference fringe moves to produce an output as indicated by the dashed line in FIG. 9. The analyzing device 22 determines the movement distances X of the respective peak positions of the interference fringe. The input voltage is determined based on equation (4) using the above-obtained peak interval A and movement distance X, and displayed on the display device 24.

A small-sized voltage detector according to a fourth embodiment is described next.

Figure 10:
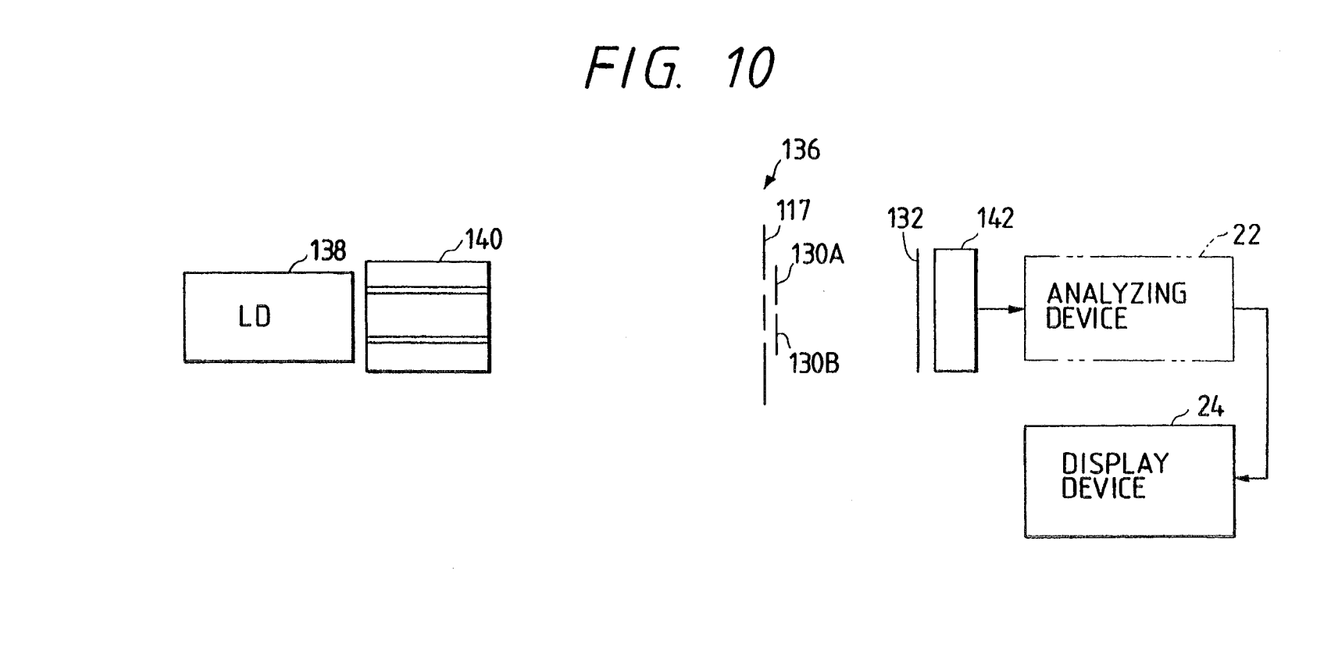
FIG. 10 is a block diagram showing a small-sized voltage detector according to a fourth embodiment of the invention.

As shown in FIG. 10, a small-sized voltage detector 136 of the fourth embodiment includes a semiconductor laser diode 138 (hereinafter referred to as "LD", and acting as the light source 12 of FIG. 7), a waveguide-type phase modulator 140 (optical modulator 16) having $V_\pi$ of 10 V, and a semiconductor position-sensitive detector 142 (photodetector 120).

Figure 11:
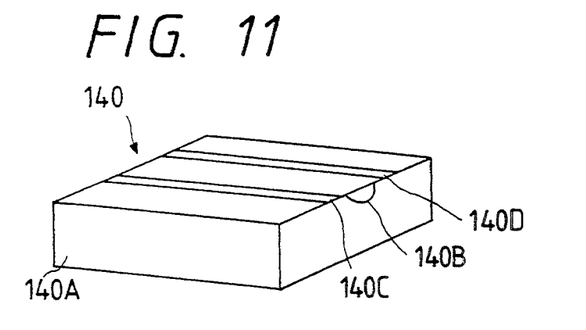
FIG. 11 is a perspective view showing a waveguide-type phase modulator used in the fourth embodiment of FIG. 10.

As shown in FIG. 11, the waveguide-type phase modulator 140 has a structure in which a titanium-diffused light waveguide 140B is formed on a substrate of a lithium niobate crystal 140A and a pair of electrodes 140C, 140D are formed on both sides of the waveguide 140B. In the waveguide-type phase modulator 140 of this embodiment, the distance between the electrodes 140C and 140D are made as small as 10 μm and the device length as long as 10 mm, to provide a small half-wave voltage $V_\pi$ of 10 V.

The face-to-face coupling is provided between the LD 138 and the titanium-diffused light waveguide 140B so that laser light from the former is input to the latter. Further, they are so arranged that the polarization direction of the output light from the LD 138 forms an angle of 45° with the z-axis of the crystal constituting the titanium-diffused light waveguide 140B.

It is noted that the single slit 116A of FIG. 7 is not used in the fourth embodiment because the output light from the titanium-diffused light waveguide 140B can be regarded as polarized light emitted from a point. light source.

Further, in the fourth embodiment, a film-type analyzer 132 is employed as in the case of the third embodiment (FIG. 8), and is directly adhered to the input surface of the semiconductor position-sensitive detector 142. The semiconductor position-sensitive detector 142 is arranged so as to detect the interference fringe formed on the input surface over a length not more than one pitch thereof, i.e., to detect only one peak of the interference fringe which corresponds to the center of gravity of the interference fringe. The voltage to be measured is applied between the pair of electrodes 140C, 140D of the waveguide-type phase modulator 140. When the voltage is applied between the electrodes 140C and 140D, the laser light traveling through the titanium-diffused waveguide 140B is subjected to phase modulation in accordance with the voltage being applied. Therefore, in the same manner as in the above embodiments, the interference fringe formed on the input surface of the semiconductorposition-sensitive detector 142 is moved in accordance with the variation of the input voltage.

If an adjustment has been made such that the output of the semiconductor position-sensitive detector 142 is zero when no voltage is applied to the waveguide-type phase modulator 140, the output itself of the semiconductor position-sensitive detector 142 becomes proportional to the voltage being applied. This means that the analyzing device can be eliminated, that is, a signal indicating the input voltage can be provided directly from the semiconductor position-sensitive detector 142 to the display device 24.

Figure 12:
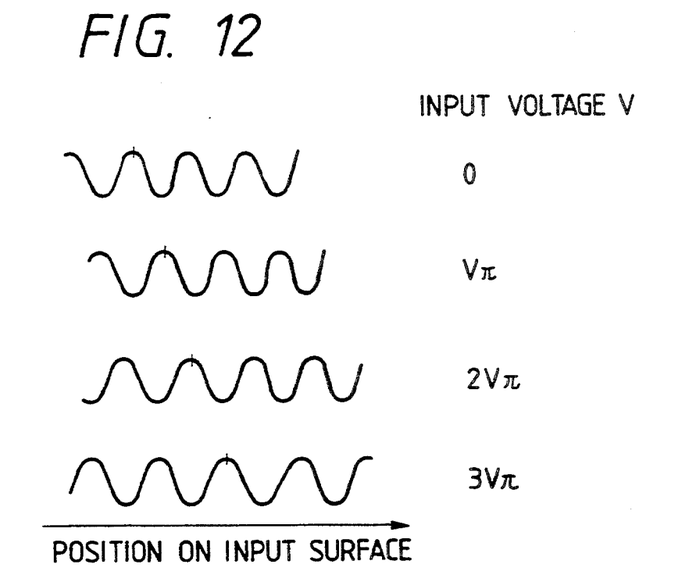
FIG. 12 shows how an interference fringe formed on an input surface of a semiconductor position-sensitive detector moves as an input voltage increases, in the fourth embodiment.

Although the optical modulator of the fourth embodiment (FIGS. 10 and 11) has a small half-wave voltage of 10 V, a voltage larger than the half-wave voltage 10 V can be detected by the voltage detector 136 according to equation (1). This is explained as follows. As the input voltage to the waveguide-type phase modulator 140 increases, the interference fringe formed on the input surface of the semiconductor position-sensitive detector 142 moves accordingly as shown in FIG. 12. Since there is no upper limit on the input voltage, the movement distance of the interference fringe does not have an upper limit either.

In the fourth embodiment of FIG. 10, the movement distance of the interference fringe can be measured precisely by examining the movement distance of more than one pitch by the analyzing device 22.

Similarly, in the second and third embodiments of FIGS. 7 and 8, a movement distance of the interference fringe can be measured correctly by analyzing the movement distance of more than one pitch by the analyzing device 22.

In the above embodiments, if the light source 12 has a broad spectrum, a wavelength selection element such as an interference filter may be disposed immediately after the light source to obtain a narrower spectrum. This improves the visibility of the interference fringe, and contributes to production of outputs having a higher S/N ratio.

In the second to fourth embodiments, the polarizing directions of the two polarizer elements attached to the double slit 117 are not limited to orthogonal ones, but may form any angle except that they are identical to each other.

What is claimed is:

1. A voltage detector comprising:
   light source means for emitting polarized light;
   modulating means for changing a polarization state of the polarized light in accordance with a voltage being applied thereto;
   polarization interferometer means, coupled to the modulating means, for producing an interference fringe; and
   detecting means for determining the voltage being applied to the modulating means at least based on a movement distance of the interference fringe formed on an input surface of the detecting means.

2. The voltage detector of claim 1, wherein the detecting means determines the voltage further based on a pitch of the interference fringe.

3. The voltage detector of claim 1, wherein the polarization interferometer means comprises a birefringent crystal to which the voltage is applied, and an analyzer disposed downstream of the birefringent crystal.

4. The voltage detector of claim 1, wherein the polarization interferometer means comprises Young's interferometer which includes a single slit and a double slit which has two slits arranged in parallel with the single slit and polarizer elements attached to the two respective slits and having orthogonal polarizing directions, and an analyzer disposed downstream of said Young's interferometer.

5. The voltage detector of claim 4, wherein the analyzer is so arranged that its polarizing direction forms angles of +45° and −45° with the polarizing directions of the polarizer elements of the double slit.

6. The voltage detector of claim 1, wherein the detecting means comprises a streak camera.

7. The voltage detector of claim 1, wherein the detecting means comprises a one-dimensional photodetector.

8. The voltage detector of claim 1, wherein the detecting means comprises a two-dimensional photodetector.

9. The voltage detector of claim 1, wherein the detecting means comprises a position-sensitive detector, and detects only one peak of the interference fringe, the one peak representing a center of gravity of the interference fringe.

10. The voltage detector of claim 1, wherein the modulating means comprises an electrooptical modulator.

11. The voltage detector of claim 10, wherein the modulating means comprises a waveguide-type phase modulator.

12. A voltage detector comprising:
    light source means for emitting polarized light of essentially a single frequency;
    modulating means for changing a polarization state of the polarized light in accordance with a voltage being applied thereto;
    polarization interferometer means, coupled to the modulating means, for producing an interference fringe; and
    detecting means for determining the voltage being applied to the modulating means at least based on a movement distance of the interference fringe formed on an input surface of the detecting means.

13. The voltage detector of claim 12, wherein the detecting means determines the voltage further based on a pitch of the interference fringe.

14. The voltage detector of claim 12, wherein the polarization interferometer means comprises a birefringent crystal to which the voltage is applied, and an analyzer disposed downstream of the birefringent crystal.

15. The voltage detector of claim 12, wherein the polarization interferometer means comprises Young's interferometer which includes a single slit and a double slit which has two slits arranged in parallel with the single slit and polarizer elements attached to the two respective slits and having orthogonal polarizing directions, and an analyzer disposed downstream of said Young's interferometer.

16. The voltage detector of claim 15, wherein the analyzer is so arranged that its polarizing direction forms angles of +45° and −45° with the polarizing directions of the polarizer elements of the double slit.

17. The voltage detector of claim 12, wherein the detecting means comprises a streak camera.

18. The voltage detector of claim 12, wherein the detecting means comprises a one-dimensional photodetector.

19. The voltage detector of claim 12, wherein the detecting means comprises a two-dimensional photodetector.

20. The voltage detector of claim 12, wherein the detecting means comprises a position-sensitive detector, and detects only one peak of the interference fringe, the one peak representing a center of gravity of the interference fringe.

21. The voltage detector of claim 12, wherein the modulating means comprises an electro-optical modulator.

22. The voltage detector of claim 21, wherein the modulating means comprises a waveguide-type phase modulator.

* * * * *